United States Patent
Kim et al.

(10) Patent No.: US 10,534,402 B1
(45) Date of Patent: Jan. 14, 2020

(54) DISPLAY DEVICE

(71) Applicant: LG ELECTRONICS INC., Seoul (KR)

(72) Inventors: Yunjoo Kim, Seoul (KR); Kyeongdong Kim, Seoul (KR); Seonkyu Kim, Seoul (KR); Hoyoung Kim, Seoul (KR); Sungjin Ahn, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/151,246

(22) Filed: Oct. 3, 2018

(30) Foreign Application Priority Data

Aug. 17, 2018 (KR) .................. 10-2018-0096295

(51) Int. Cl.
| | |
|---|---|
| *G06F 1/16* | (2006.01) |
| *H05K 1/11* | (2006.01) |
| *H05K 5/02* | (2006.01) |
| *H05K 5/00* | (2006.01) |
| *H05K 1/18* | (2006.01) |

(52) U.S. Cl.
CPC .......... *G06F 1/1652* (2013.01); *H05K 1/118* (2013.01); *H05K 1/189* (2013.01); *H05K 5/0017* (2013.01); *H05K 5/0217* (2013.01)

(58) Field of Classification Search
USPC ........................................................ 361/749
See application file for complete search history.

(56) References Cited

U.S. PATENT DOCUMENTS

| | | | | |
|---|---|---|---|---|
| 2012/0002357 | A1* | 1/2012 | Auld | ............ G09F 9/33 361/679.01 |
| 2014/0078685 | A1* | 3/2014 | Lee | ............ H05K 5/0017 361/730 |
| 2016/0363960 | A1 | 12/2016 | Park et al. | |
| 2017/0013726 | A1 | 1/2017 | Han et al. | |
| 2018/0070466 | A1 | 3/2018 | Kim et al. | |
| 2019/0029131 | A1 | 1/2019 | Han et al. | |
| 2019/0174644 | A1 | 6/2019 | Kim et al. | |

FOREIGN PATENT DOCUMENTS

| | | |
|---|---|---|
| EP | 3107083 | 12/2016 |
| EP | 3115988 | 1/2017 |
| KR | 1020160129669 | 11/2016 |
| KR | 1020170062342 | 6/2017 |

OTHER PUBLICATIONS

European Patent Office Application Serial No. 19153030.2, Search Report dated Aug. 27, 2019, 6 pages.

* cited by examiner

*Primary Examiner* — Andargie M Aychillhum
(74) *Attorney, Agent, or Firm* — Lee, Hong, Degerman, Kang & Waimey PC

(57) ABSTRACT

A display device includes a roller, and a display module wound around the roller or unwound from the roller. The display module includes a display panel, and a plurality of supporters disposed at a rear portion of the display panel while expending in a horizontal direction and supporting the display panel. Each supporter has a height 0.1-0.6 times greater than a radius of the roller.

14 Claims, 12 Drawing Sheets

DISPLAY DEVICE

CROSS-REFERENCE TO RELATED APPLICATIONS

Pursuant to 35 U.S.C. § 119(a), this application claims the benefit of earlier filing date and right of priority to Korean Patent Application No. 10-2018-0096295, filed on Aug. 17, 2018, the contents of which are hereby incorporated by reference herein in its entirety.

TECHNICAL FIELD

The present invention relates to a display device.

BACKGROUND

As the information society develops, the demand for display devices is increasing in various forms. In recent years, various display devices such as liquid crystal display device (LCD), plasma display panel (PDP), electro luminescent display (ELD), and vacuum fluorescent display (VFD) have been used.

A display device using an organic light emitting diode (OLED) is superior to a liquid crystal display (LCD) in terms of luminance characteristics and viewing angle characteristics, and does not require a backlight unit, thereby realizing a thin display device.

A portion of the display may be bent or rolled around the roller, and a display device that is unfoldable or rollable around a roller may be implemented by using the flexible display as needed. At this time, there is a problem that the flexible display is stably rolled around or unrolled from the roller.

SUMMARY

The present invention is to provide a display device capable of minimizing the damage to a display panel while enhancing the flatness of the display panel when the display panel is spread.

According to an embodiment of the present invention, there is provided a display device including a roller, and a display module wound around the roller or unwound from the roller, and the display module includes a display panel and a plurality of supporters disposed at a rear portion of the display panel while expending in a horizontal direction and supporting the display panel.

Each supporter may have a height 0.1-0.6 times greater than a radius of the roller.

The supporter may have a thickness 0.08-0.16 times thicker than the radius of the roller.

A sectional shape of each supporter may have a rectangular shape extending in a vertical direction. The supporter may have a thickness 0.26-0.8 times greater than the height of the supporter.

The display module may further include an adhesive member fixed to a front surface of the supporter and a back surface of the display panel. The height of the supporter may be 7-50 times greater than a thickness of the adhesive member. The supporter may have a thickness 6.25-12.5 times greater than the height of the supporter.

A sectional shape of each supporter may have a rectangular shape extending in a vertical direction. The supporter may have a thickness 0.26-0.8 times greater than the height of the supporter.

The supporter has at least one opening formed through the supporter to be open in a vertical direction.

The supporter may have a plurality of openings and the openings are spaced apart from each other in the horizontal direction in the supporter.

The display device may further include an upper bar disposed at an upper portion of the display module, a source printed circuit board (PCB) disposed on the upper bar, a timing controller board disposed on the roller, and a cable connecting the source PCB to the timing controller board.

The plurality of supporters are formed with respective openings to be connected to each other, and the cable is disposed through the openings of the plurality of supporters.

The supporter may include a rear cover disposed at the rear portion of the display panel, and a side cover protruding from the rear cover to cover a lateral side of the display panel.

The rear cover may include a front body, and a rear body positioned at a rear portion of the front body and spaced apart from the front body in a front-rear direction.

The rear cover may include a top body linking an upper end of the front body to an upper end of the rear body, and a lower body linking a lower end of the front body to a lower end of the rear body.

The side cover may include a side body bent from the rear body to shield a gap between the front body and the rear body.

The supporter has a space formed therein while extending in the horizontal direction.

According to an embodiment of the present invention, the display panel may be wound in the shape similar to the shape of a circle as much as possible. In addition, a portion of the display panel may be prevented from being sharply bent and stress concentration on the display panel may be minimized.

In addition, when the display panel and the plurality of supporters are wound around the roller, the space occupied by the display panel and the supporters, which are wound around the roller, may be minimized, and thus a compact-size structure may be possible.

In addition, when the display panel is spread, the bending in the portion of the display panel may be minimized, and the display panel may be maintained with a sufficient flatness.

In addition, the supporter may support and protect the cable, and may maintain and protect the cable with reliability.

Further, the structure to fix the cable may be minimized and the number of portions may be minimized.

The supporter may have a light weight due to the opening and the space, and the material cost of the supporter may be reduced.

Furthermore, the supporter may protect the lateral side of the display panel. Accordingly, when compared with the case of mounting an additional side cover to cover the lateral side of the display panel, the structure may be more simplified and the lateral side of the display panel may have a luxurious outer appearance.

DETAILED DESCRIPTION

Hereinafter, specific embodiments of the present invention will be described in detail with reference to the accompanying drawings.

Figure 1:
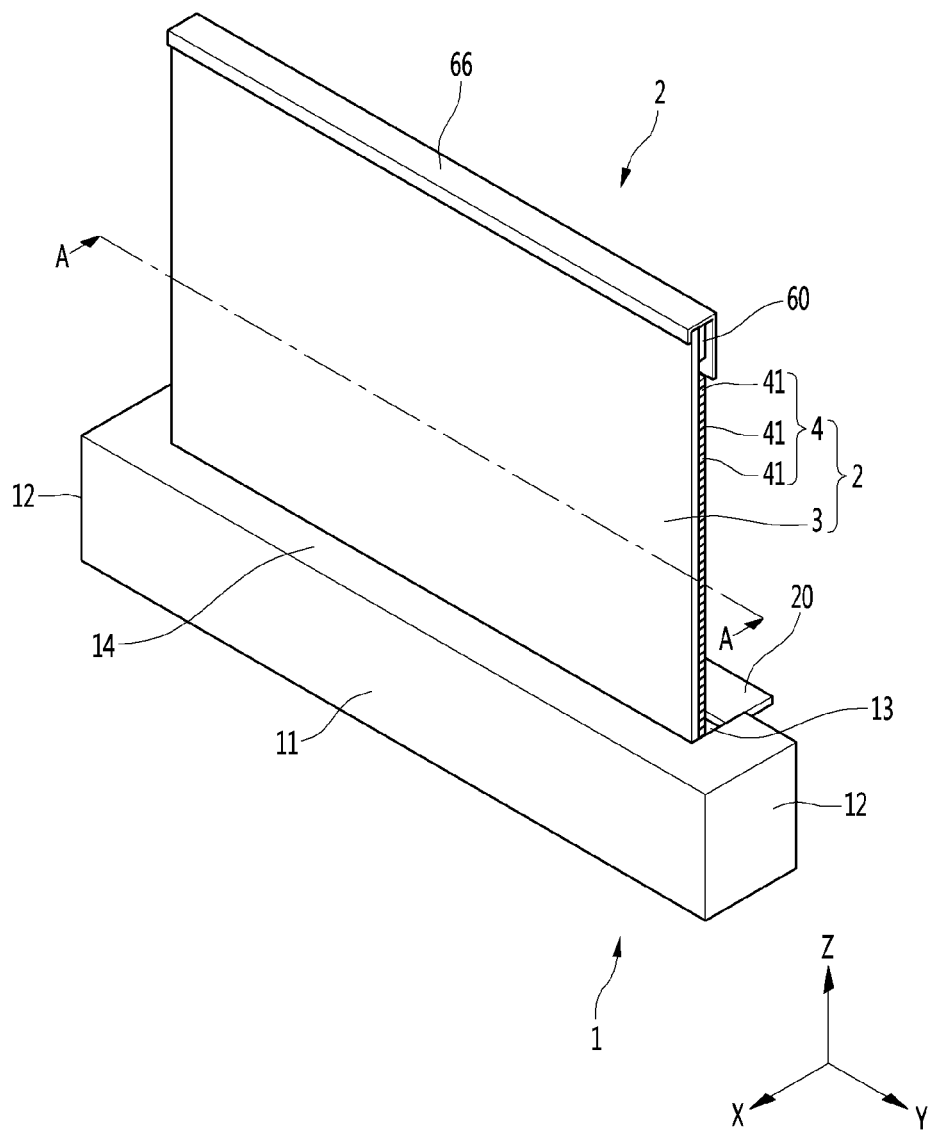
FIG. 1 is a perspective view of a display device according to an embodiment of the present invention.
Figure 2:
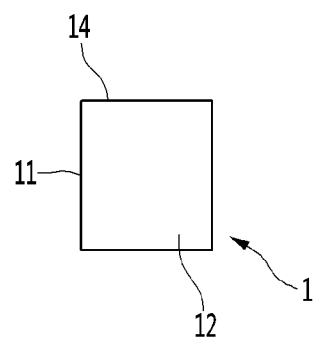
FIG. 2 is a side view of a display module hidden by the housing according to an embodiment of the present invention.
Figure 3:
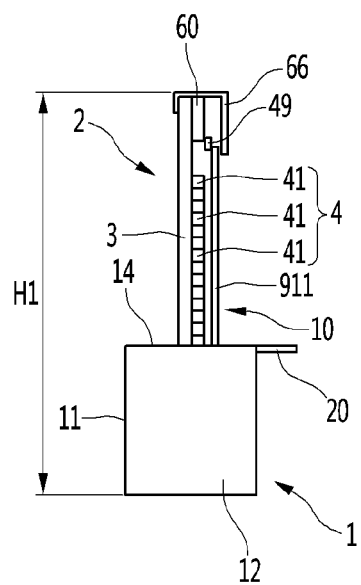
FIG. 3 is a side view of the display module when a portion of the display module is lifted from the housing illustrated in FIG. 2.
Figure 4:
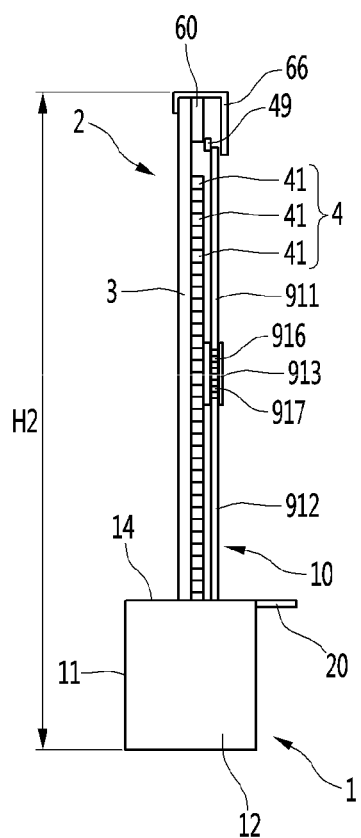
FIG. 4 is a side view of a display module when the display module is lifted to the maximum height according to an embodiment of the present invention.

FIG. 1 is a perspective view of a display device according to an embodiment of the present invention. FIG. 2 is a side view of a display module hidden by a housing according to an embodiment of the present invention. FIG. 3 is a side view of the display module when a portion of the display module is lifted from the housing illustrated in FIG. 2. FIG. 4 is a side view of a display module when the display module is lifted to the maximum height according to an embodiment of the present invention.

Figure 5:
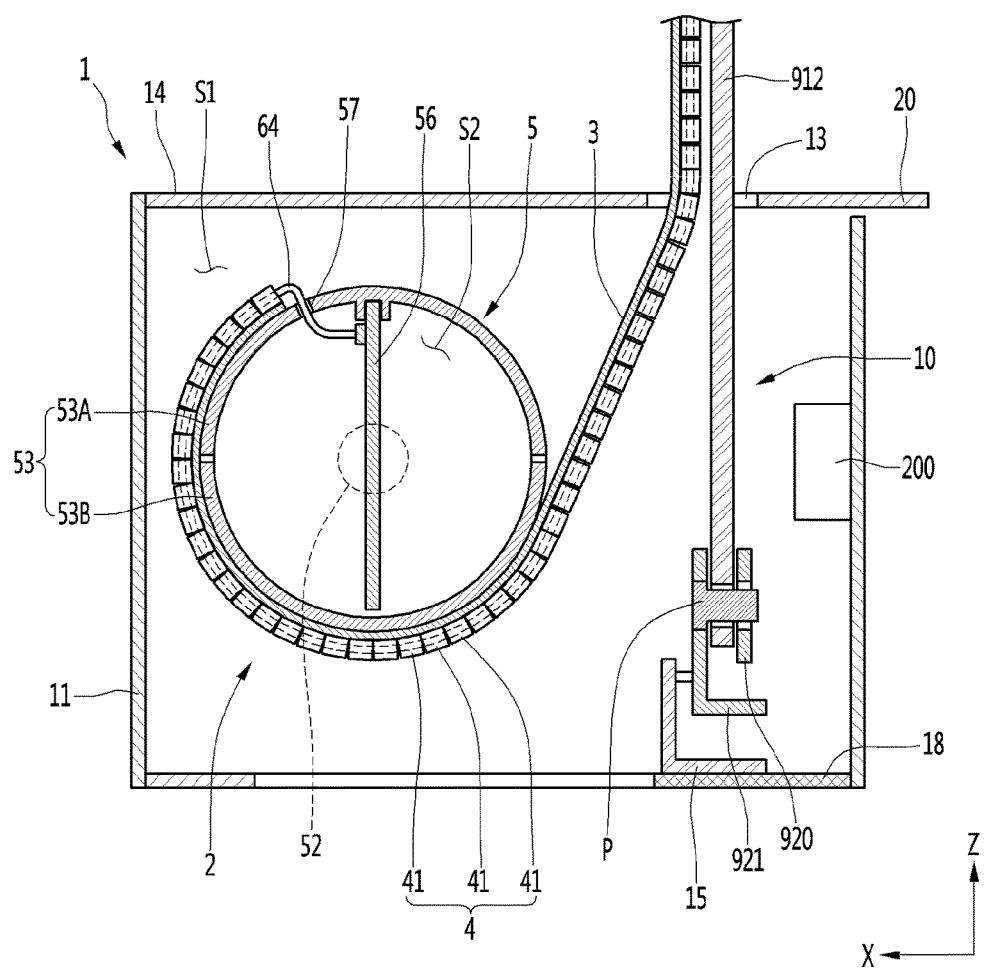
FIG. 5 is a sectional view illustrating an inner portion of the housing according to an embodiment of the present invention.
Figure 6:
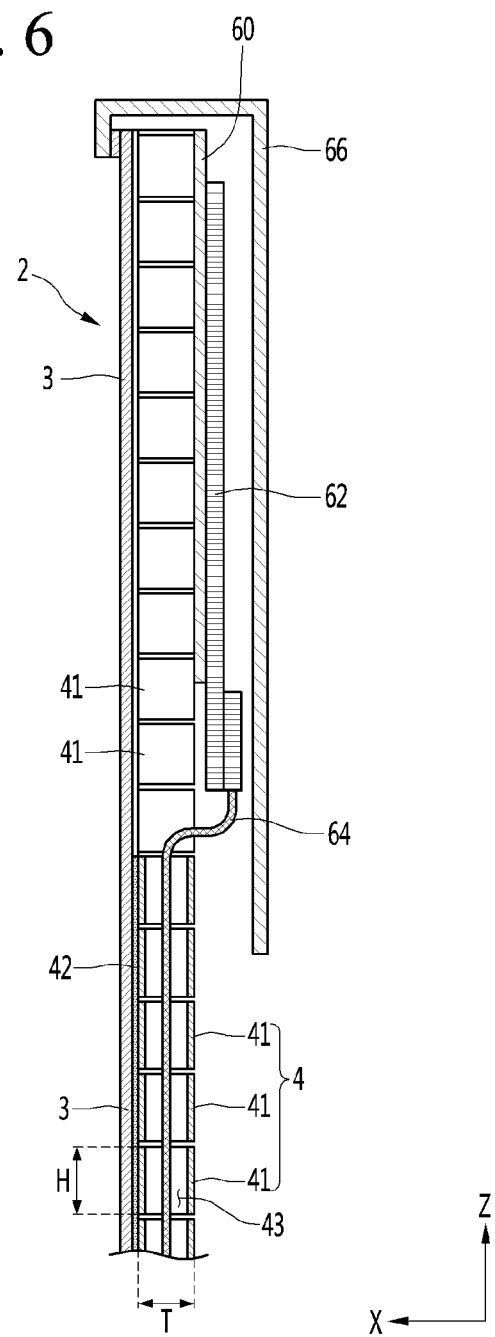
FIG. 6 is a sectional view illustrating an inner portion of a top case according to an embodiment of the present invention.

FIG. 5 is a sectional view illustrating an inner portion of the housing according to an embodiment of the present invention. FIG. 6 is a sectional view illustrating an inner portion of a top case according to an embodiment of the present invention.

A display device includes a housing 1 and a display module 2 lowered to the housing 1 or lifted from the housing 1. The display module 2 may include a display panel 3 and a display cover 4.

The display device may further include a roller 5. The display module 2 may be wound around the roller 5 or may be unwound from the roller 5. The roller 5 may be disposed in the housing 1.

The display device may include a lift module 10 (see FIGS. 3-5 and FIGS. 7 to 9) to lift or to drop the display module 2. The lift module 10 may be connected to the display module 2. The lift module 10 may be connected to an upper portion of the display module 2. In addition, a lower portion of the display module 2 may be connected to the roller 5.

The display module 2 may be spread upward or may be wound around the roller 5 in the state that the display module 2 is connected to the roller 5 and the lift module 10.

The display device may have the thickness in a front-rear direction X, has a length in a left-right direction Y, and has a height in an up-down direction Z.

The housing 1 may include an assembly including a plurality of members. The housing 1 may be formed therein with a space S1 (see FIG. 5) in which the roller 5 is received. When the display module 2 is dropped, the display module 2 may be received together with the roller 5 in the space S1.

The housing 1 may include a front cover 11 to cover the roller 5 in front of the roller 5. The front cover 11 may form a front outer appearance of the housing 1.

The housing 1 may further include at least one side cover 12 to cover the roller 5 at the side of the roller 5. The side cover 12 may form a side outer appearance of the housing 1. A pair of side covers 12 may be provided and may include a left cover positioned at the left side of the roller 5 and a right cover positioned at the right side of the roller 5.

The housing 1 may be formed therein with an opening 13 through which the display module 2 passes. The opening 13 may be formed in an upper portion of the housing 1. The opening 13 may be formed in the upper portion of the housing 1 such that the opening 13 is open in a vertical direction.

The housing 1 may further include a top cover 14 to form an outer appearance of the top surface of the housing 1. The opening 13 may be formed in the top cover 14 to be open in the vertical direction.

The housing 1 may further include a lower frame 18. The lower frame 18 may be disposed in a horizontal direction between the paired of side covers 12. The lower frame 18 may be connected to the paired of side covers 12.

The housing 1 may further include a back cover 19 to cover a portion of the lift module 10, which is received in the space S1 of the housing 1. The back cover 19 may be disposed to extend in a horizontal direction between the paired of side covers 12. The lower frame 18 may be connected to the paired of side covers 12.

The display device may include a door 20 to open or close the opening 13. The door 20 may be disposed in the housing 1. The door 20 may be disposed at the top cover 14 to retract in the horizontal direction or to rotate in the vertical direction.

The door 20 may be moved to a position of opening the opening 13 or rotated before at least a portion of the display module 2 is lifted to an upper portion of the housing 1.

The door 20 may be positioned at the opening 13 and may cover the opening 13 when an entire portion of the display module 2 has been completely inserted into the housing 1.

The roller 5 may be disposed rotatably inside the housing 1. The roller 5 may be received rotatably inside the housing 1. The housing 1 may be provided therein with a roller supporter 51 (see FIGS. 7 to 9) to rotatably support the roller 5. A pair of roller supporters 51 may be provided in the housing 1. The roller 5 may be interposed between the pair of roller supporters 51 and may be rotatably supported by the pair of roller supporters 51.

The roller 5 may include a rotational shaft 52 rotatably supported by the roller supporter 51.

The roller 5 may include a roller body 53 around which the display module 2 is wound. The roller body 53 may be connected to the rotational shaft 52 or may be integrated with the rotational shaft 52. The roller body 53 may be rotated about the rotational shaft 52.

The roller 5 may be formed therein with an inner space S2. The roller body 53 may include an assembly of a plurality of members. The roller 5 may have the shape of a hollowed cylinder having the inner space S2 therein. The roller 5 may include the assembly of the first roller body 53A and the second roller body 53B. The inner space S2 may be formed between the first roller body 53A and the second roller body 53B.

A timing controller board 56 (see FIG. 5) may be received in the space S2 of the roller 5. The timing controller board 56 may be connected to a source printed circuit board 62 (see FIG. 6), which is to be described below, by using a cable 64.

The roller 5 is formed therein with a cable through hole 57 (see FIG. 5) through which the cable 64 passes. The cable 64 may be connected to the timing controller board 56 in the state that the cable 64 passes through the cable through hole 57. The cable through hole 57 may be radially formed through one side of the roller body 53.

Meanwhile, referring to FIG. 6, the display device may further include an upper bar 60, a source PCB 62, and a cable 64. In addition, the display device may further include a top case 66.

The upper bar 60 may be provided at an upper portion of the display module 2. The upper bar 60 may be connected to an upper portion of at least one of the display panel 3 and the display cover 4. The upper bar 60 may be connected to the top case 66.

The source PCB 62 may be provided on the upper bar 60. The source PCB 62 may include signal wires to transmit digital video data and timing control signals received from the timing controller board 56. The source PCB 62 may be connected to the display panel 3 by a source COF (chip on film; not illustrated). The source COF connected to one side of the source PCB 62 may extend to an active region of the display panel 3 and thus may be connected to the display panel 3. The COF may be connected to an upper portion of the display panel 3.

The cable 64 may connect the source PCB 62 to the timing controller board 56. The cable 64 may have one end electrically connected to the source PCB 62 and an opposite end electrically connected to the timing controller board 56.

The cable 64 may include a cable bendable according to the shape of the display cover 4. In detail, the cable 64 may be a flexible flat cable (FFC) or flexible printed circuit (FPC) cable.

The cable 64 may be disposed to pass through the plurality of supporters 41. The cable 64 may be disposed to pass through the openings 43 formed in the plurality of supporters 41.

The cable 64 may include a first portion passing through the cable through hole 57 of the roller 5 and electrically connected to the timing controller board 56, a second portion connected to the first portion and passing through the plurality of supporters 41, and a third portion electrically connected to the source PCB 64. Preferably, the cable 64 is disposed such that the widest portion of the cable 64 passes through the plurality of supporters 41.

The top case 66 may be disposed to surround the upper portion of the display module 2 or may be disposed to surround the upper portion of the display module 2, the upper bar 60, and the source PCB 62. The top case 66 may be connected to the upper bar 60 or may be connected to the upper portion of the display module 2.

A portion of the upper portion of the display module 2, the upper bar 60, and the source PCB 62 may be positioned inside the top case 66, and may be protected by the top case 66.

The display module 2 may be wound around the roller 5 and the entire portion of the display module 2 may be received in the space S1. In addition, at least a portion of the display module 2 may be unwound from the roller 5 and may be lifted from the space S1.

The thickness of the display module 2 may be thinner than the thickness of the housing 1. The length of the housing 1 may be longer than the length of the display module 2. When the display module 2 is spread, the height of the display module 2 (the height of the upper end of the display module) may be higher than the height of the housing 1 (that is, the height of the upper end of the housing). When the display module 2 is dropped as much as possible, the entire portion of the display module 2 is inserted into the space S1 of the housing 1 and hidden by the housing 1. When at least a portion of the display module 2 is lifted onto the housing 1, the display module 2 may be exposed onto the housing 1.

As illustrated in FIG. 2, the entire portion of the display module 2 is inserted into and received in the housing 1. As illustrated in FIG. 3, only a portion of the display module 2 may be lifted to a predetermined height H1 from the top surface of the housing 1. As illustrated in FIG. 4, the display module 2 may be lifted to the maximum height H2.

The display module 2 may be connected to the roller body 53. When the roller body 53 rotates about the rotational shaft 52, the display module 2 may be wound around or unwound from the roller body 53 in the state that the display module 2 is connected to the roller body 53.

Preferably, the display panel 3 has elasticity allowing bending or rolling, like an OLED. In this case, the display panel 3 may be a flexible display panel.

The display panel 3 may display an image through the front surface thereof. A region of the display panel 3, which is exposed onto the housing 1, may be an active region allowing a user to view an image from the outside. A region of the display panel 3, which is positioned in the space S1 of the housing 1, may be an inactive region in which the user does not view the image from the outside.

The display cover 4 may be disposed on the back surface of the display panel 3 or may cover the back surface of the display panel 3. The display cover 4 may be a panel supporter to support the display panel 3.

The display device may include a plurality of supporters 41 to support the display panel 3. The plurality of supporters 41 may constitute the display cover 4. Each of the plurality of supporters 41 may be arranged to extend in the horizontal direction at the rear portion of the display panel 3.

The plurality of supporters 41 may be attached to the back surface of the display panel 3. The display module 2 may further include an adhesive member 42 (see FIG. 6) to fix the plurality of supporters 41 to the display panel 3.

The plurality of supporters 41 may be attached to the back surface of the display panel 3 by the adhesive member 42. The adhesive member 42 may fix the back surface of the display panel 3 to the front surface of the supporter 41.

The adhesive member 42 may include a double-sided tape or may include an adhesive interposed between the display panel 3 and the supporters 41.

When the display module 2 further includes the adhesive member 42, the adhesive member 42 may be attached to the back surface of the display panel 3. In addition the plurality of supporters 41 may be bonded to the back surface of the adhesive member 42 while extending in the horizontal direction to support the display panel 3 and the adhesive member 42.

The plurality of supporters 41 may be arranged to be stacked in the vertical direction Z when the display panel 3 is upright. The upper end of the supporter, which is provided at the lower position, of the plurality of supporters 41 may make contact with a lower end of the supporter, which is positioned above the supporter provided at the lower position. In detail, a supporter positioned at the lower position may support a supporter at the upper position.

When the display panel 3 is wound around the roller 5, the gap may be made between the plurality of supporters 41. The plurality of supporters 41 may be wound around the roller 5 together with the display panel 3 and the adhesive member 42 in the state that the plurality of supporters 41 are bonded to the display panel 3 by the adhesive member 42.

Each of the plurality of supporters 41 may have a three dimensional shape having a height H and a thickness T as illustrated in FIG. 6. Each of the plurality of supporters 41 may have the shape of a bar extending in the horizontal direction Y. The supporter 41 has the height H in the vertical direction Z and the thickness T in the front-rear direction X. The sectional shape of each supporter 41 may have a rectangular shape extending in the vertical direction.

At least one portion of the supporter 41 may be different from another portion of the supporter 41 in height H or thickness T. Opposite end portions of the supporter 41 may be different from the intermediate portion between the opposite end portions of the supporter 41 in at least one of height H or thickness T. For example, the thicknesses of the opposite end portions of the supporter 41 may be thicker than or thinner than the intermediate portion between the opposite end portions of the supporter 41.

Meanwhile, the overall shapes of the plurality of supporters 41 may be identical to each other. In addition, for example, the plurality of supporters 41 may have equal horizontal length. For another example, the plurality of supporters 41 may include at least one supporter having a longer length and at least one supporter having a shorter length.

Figure 7:
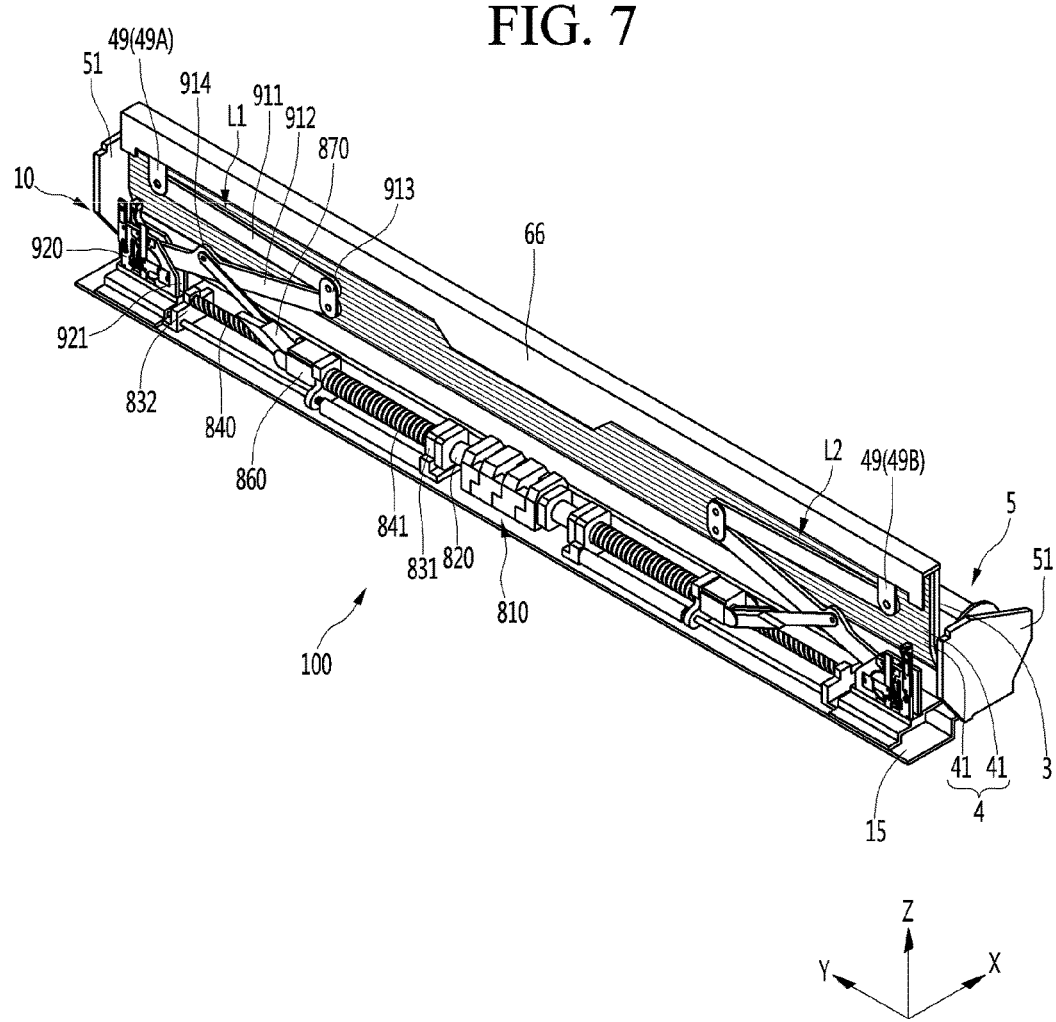
FIG. 7 is a perspective view when the lift module drops the display module according to an embodiment of the present invention.
Figure 8:
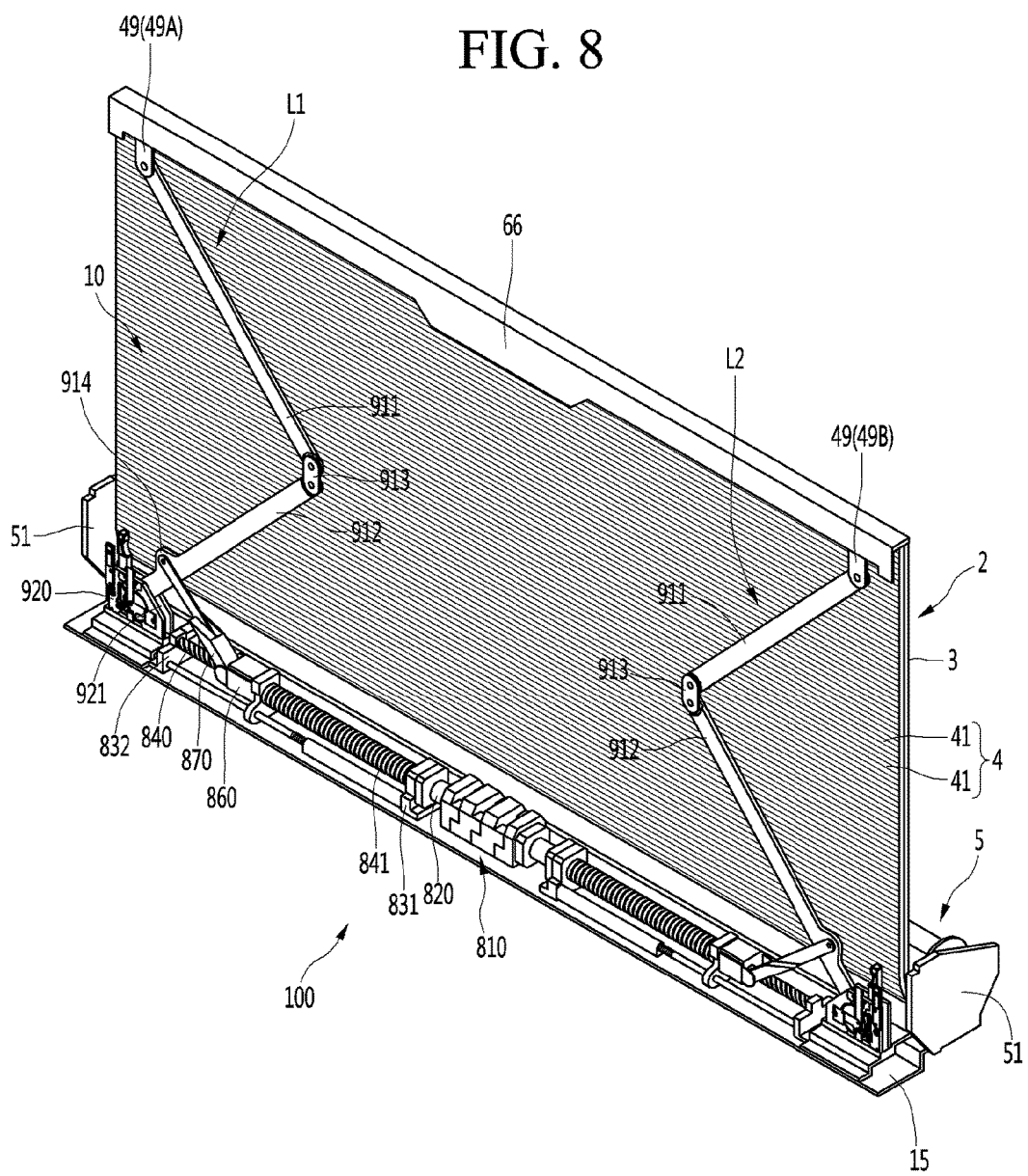
FIG. 8 is a perspective view of the display module while the lift module lifts the display module according to an embodiment of the present invention.
Figure 9:
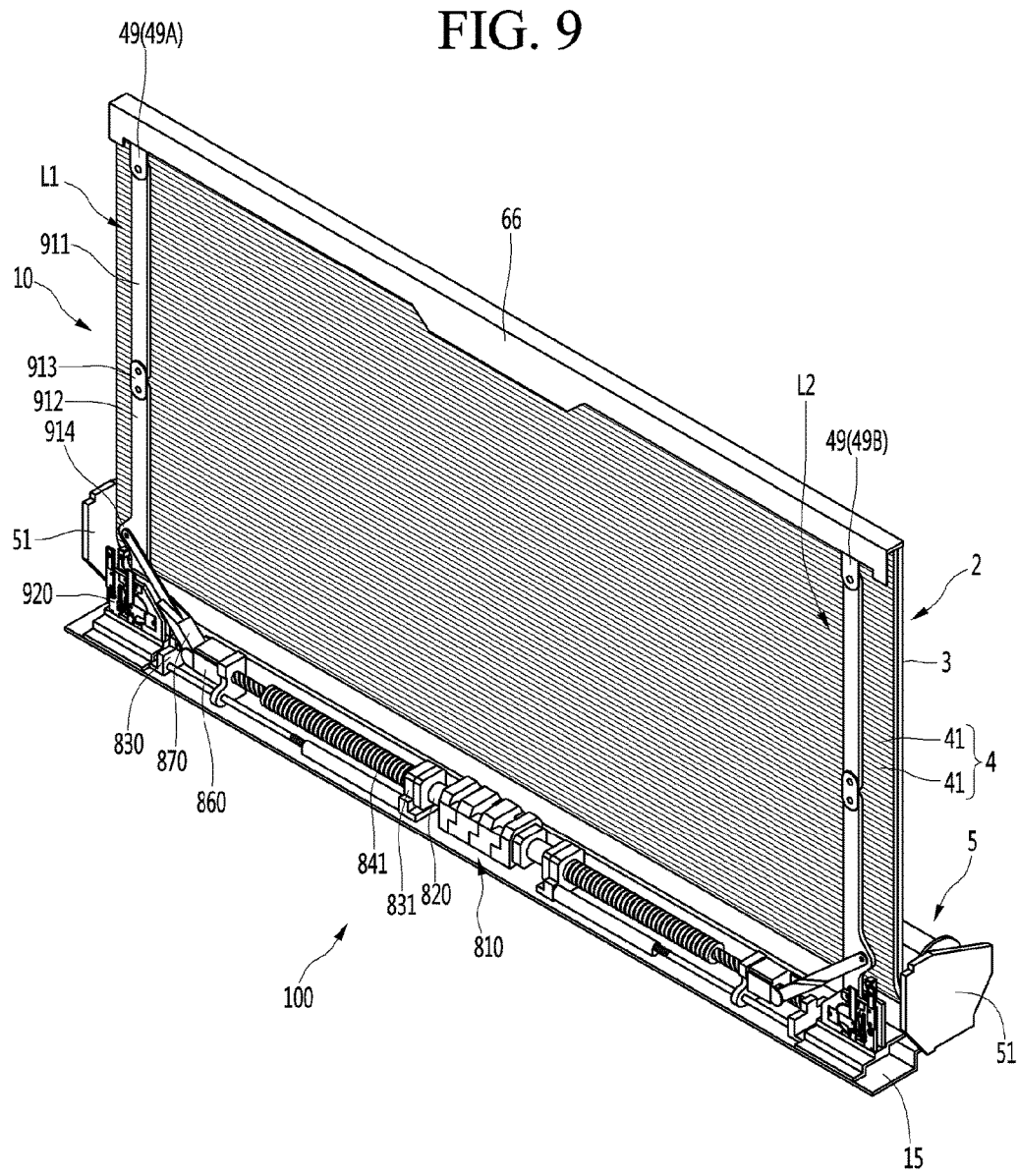
FIG. 9 is a perspective view of the display module while the lift module lifts the display module to the maximum height according to an embodiment of the present invention.

FIG. 7 is an enlarged rear view of the angle sensor module according to an embodiment of the present invention. FIG. 8 is a partial cut-out perspective view of the angle sensor module according to an embodiment of the present invention.

The lift module 10 may include a pair of arms 911 and 912. The lift module 10 may further include an arm joint 913 connected to each of the pair of arms 911 and 912.

The pair of arms 911 and 912 may include a first arm 911 and a second arm 912. When one of the first arm 911 and the second arm 912 is rotated, the other may be connected to interlock and rotate.

Each of the first arm 911 and the second arm 912 may be rotatably connected to the arm joint 913. A driven gear 916 (see FIG. 4) may be formed on the first arm 911, and a driving gear 917 (see FIG. 4) may be formed on the second arm 912. The driving gear 917 is engaged with the driven gear 916 to rotate the driven gear 916.

Upon rotation of the second arm 912, the driving gear 917 may rotate the driven gear 916 in engagement with the driven gear 916. Upon rotation of the driven gear 915, the first arm 911 may be rotated about the driven gear 916.

The first arm 911 may be rotatably connected to the upper portion of the display module 2. The first arm 911 may be a driven arm which lifts and lowers the upper portion of the display module 2 while relatively rotating with the second arm 912. The driven arm may be connected directly to the display module 2 and may be connected to the display module 2 through a separate upper bracket 49 and the upper bar 60.

When the second arm 912 rotates, the first arm 911 lifts and lowers the upper bar 60 and the display module 2 may be unwound from or wound around the roller 5.

The first arm 911 may be rotatably connected to the upper bar 60 and may be rotatably connected to the upper bar 60 on the upper bracket 49. The upper bracket 49 may be fastened to the upper bar 60 with a fastening member such as a screw. The upper portion of the first arm 911 may be connected to the upper bar 60 or the upper bracket 49 by a hinge pin.

The lower portion of the first arm 911 may be rotatably connected to the upper portion of the arm joint 913. The lower portion of the first arm 911 may be connected to the upper portion of the arm joint 913 by a hinge pin.

The driven gear 916 may be formed below the first arm 911.

The second arm 912 may be a driving arm which rotates the first arm 911. The second arm 912 may be connected to the first arm 911 to rotate the first arm 911. The second arm 912 may be rotatably connected to the lower portion of the arm joint 913. The upper portion of the second arm 912 may be connected to the lower portion of the arm joint 913 by a hinge pin. The driving gear 917 engaged with the driven gear 916 may be formed on the upper portion of the second arm 912.

The second arm 912 may be rotatably supported on the housing 1. The second arm 912 may be rotatably connected to the lift module supporter 15 and may be rotatably connected to the separate arm supporters 920 and 921.

The lift module supporter 15 may be provided on the lower frame 18 (see FIG. 5) and may be supported by the lower frame 18.

The arm supporters 920 and 921 may be mounted on the lift module supporter 15, and may rotatably support the second arm 912 in a state of being vertically erected on the lift module supporter 15.

The second arm 912 may be connected to an arm shaft P (see FIG. 3), which is a rotation center shaft of the second arm 912, and the second arm 912 may be rotated around the arm shaft P. The arm shaft P may be a horizontal shaft connected to the second arm 912, and may be arranged to be elongated in the front-back direction. The arm shaft P may be fastened to the second arm 912 so as to rotate integrally with the second arm 912 when the second arm 912 rotates.

The arm shaft P may be formed separately from the second arm 912 and then coupled to the second arm 912, or may integrally protrude from the second arm 912.

The arm shaft P may be rotatably supported by the arm supporters 920 and 921. A pair of arm supporters 920 and 921 may be provided, and the arm shaft P may be rotatably supported by the pair of arm supporters 920 and 921.

One of the pair of arm supporters 920 and 921 may be a first arm supporter mounted on the lift module supporter 15, the other of the pair of arm supporters 920 and 921 may be a second arm supporter mounted on the first arm supporter. A space in which a portion of the second arm 912 is rotatably accommodated may be formed between the pair of arm supporters 920 and 921. The first arm supporter and the second arm supporter may be fastened by a fastening member such as a screw.

The pair of arm supporters 920 and 921 may be formed with through-holes through which the arm shaft P rotatably passes, and an arm shaft supporter such as a bearing for supporting the arm shaft P may be disposed in the through-hole.

When the second arm 912 is rotated about the arm shaft P, the second arm 912 may be rotated perpendicularly or substantially perpendicularly. The arm shaft P may rotatably connect the lower portion of the second arm 912 to the arm supporters 920 and 921.

The first arm 911 and the second arm 912 may be folded or unfolded while being connected to the arm joint 913. When the second arm 912 is rotated horizontally or substantially horizontally to the housing 1, the first arm 911 is horizontally or substantially horizontally laid down like the second arm 912 in a state of being connected to the arm joint 913. On the other hand, when the second arm 912 is rotated perpendicularly or substantially perpendicularly to the housing 1, the first arm 911 is erected perpendicularly or substantially perpendicularly like the second arm 912 above the second arm 912.

The display device may further include a rotation mechanism 100 (see FIGS. 4 to 9) which is connected to the second arm 912 to rotate the second arm 912. The rotation mechanism 100 may include a driving source such as a motor, and at least one power transmission member which transmits the driving force of the driving source to the second arm 912.

The display device may further include a control module 200 (see FIG. 5) which controls the rotation mechanism 100. The control module 200 may be accommodated in the space S1 of the housing 1 and may be protected by the housing 1. The control module 200 may include a main board having a circuit portion for controlling the rotation mechanism 100. The control module 200 may control the driving source of the rotation mechanism 100. When the control module 200 drives the driving source of the rotation mechanism 100, the second arm 912 and the first arm 911 are rotated and the display module 2 may be unwound from or wound around the roller 5 by the rotation of the first arm 911.

The lift module 10 may further include the rotation mechanism 100 which rotates the second arm 912. The first arm 911, the second arm 912, the arm joint 913, and the rotation mechanism 100 may constitute the lift module 10 which lifts and lowering the upper portion of the display module 2.

The first arm 911, the second arm 912 and the arm joint 913 may constitute a link assembly. The link assembly may interlock with the rotation mechanism 100 to lift and lower the display module 2.

The display device may include a plurality of link assemblies which are assemblies of the first arm 911, the second arm 912, and the arm joint 913.

The plurality of link assemblies L1 and L2 are capable of vertically lifting and lowering the display module 2 together in a state of being horizontally spaced apart. The rotation mechanism 100 may be connected to each of the plurality of link assemblies L1 and L2 and may operate the plurality of link assemblies L1 and L2 together.

The plurality of link assemblies L1 and L2 may include a pair of link assemblies, and the pair of link assemblies may include a left link assembly L1 and a right link assembly L2. The left link assembly L1 and the right link assembly L2 may be spaced from each other in the horizontal direction and may be symmetrically arranged in the horizontal direction.

When the display device includes both the left link assembly L1 and the right link assembly L2, the first arm 911 of the left link assembly L1 may be connected to the left upper bracket 49A mounted on the left side of the upper bar 60 by a hinge pin, and the first arm 911 of the right link assembly L2 may be connected to the right upper bracket 49B mounted on the right side of the upper bar 60 by a hinge pin.

The rotation mechanism 100 may be connected to the second arm 912 to rotate the second arm 912 about the arm shaft. The second arm 912 may be formed in a connection portion 914 to which the rotation mechanism 100 is connected. The connecting portion 914 may be formed between the arm shaft P and the driving gear 918 of the second arm 912.

The rotation mechanism 100 may push or pull the second arm 912 in a state of being connected to the connecting portion 914, and the second arm 912 may be rotated about the arm shaft P when pushed or pulled by the rotation mechanism 100. When the rotation mechanism 100 pushes the connecting portion 914, the second arm 912 may be erected while rotating about the arm shaft P clockwise or counterclockwise (for example, clockwise). On the contrary, when the rotation mechanism 100 pulls the connecting portion 914, the second arm 912 may be laid down while rotating about the arm shaft P clockwise or anticlockwise (for example, counterclockwise).

The rotation mechanism 100 may include at least one motor 810, a lead screw 840 rotated by the motor 810, a slider 860 slid along the lead screw 840 during rotation of the lead screw 840, and a connecting rod 870 connected to the slider 860 and the second arm 912 to push and pull the second arm 912 when the slider 860 slides.

When the rotation mechanism 100 rotates the pair of link assemblies L1 and L2 together, the rotation mechanism 100 may include at least one motor 810, a pair of lead screws 840, a pair of sliders 860, and a pair of connecting rods 870. When the display device includes the pair of link assemblies L1 and L2, the lead screw 840, the slider 860, and the connecting rod 870 may horizontally symmetrical with respect to the motor 180.

The motor 810 may be installed in the lift module supporter 15. The motor 810 may be a BLDC motor.

The driving shaft of the motor 810 may be disposed on both sides of the motor 810. The right driving shaft and the left driving shaft of the motor 810 may rotate in the same direction. Alternatively, the right driving shaft and the left driving shaft of the motor assembly 810 may rotate in opposite directions.

The lead screw 840 may be connected to the driving shaft of the motor 810 by a coupling 820.

The lead screw 840 may be disposed to penetrate the slider 860. A thread may be formed on the outer periphery of the lead screw 840.

The rotation mechanism 100 may further include at least one bearing 831 and 832 which supports the lead screw 840. The bearings 831 and 832 supporting the lead screw 840 may be mounted on the lift module supporter 15. The lead screw 840 may be rotatably supported by the pair of bearings 831 and 832. The pair of bearings 831 and 832 may be spaced from each other in the longitudinal direction of the lead screw 840.

The slider 860 may be formed with a hollow portion through which the lead screw 840 passes. The hollow portion of the slider 860 may be formed with a thread engaged with the thread of the lead screw, and may be linearly moved along the lead screw 840 in the longitudinal direction of the lead screw 840 during the rotation of the lead screw 840.

The rotation mechanism 100 may further include a spring 841 which elastically supports the slider 860. The length of the spring 841 may be shorter than the length of the lead screw 840. The spring 841 may be disposed between the bearing 831 and the slider 860. The spring 840 may be disposed between the slider 860 and the bearing 831 closer to the motor 810 among the pair of bearings 831 and 832. The spring 841 may be disposed so as to surround a portion of the outer periphery of the lead screw 840. One end of the spring 841 may be connected to the bearing 831, and the other end may be separated from or in contact with the slider 860.

The spring 841 may be pushed and pressed by the slider 860 when the second arm 912 is laid horizontally. When the second arm 912 starts to be erected, the spring 841 may press the slider 860 in a direction opposite to the motor 810 while being restored to an original state.

When the restoring force of the spring 841 acts on the slider 860 as described above, the initial load of the motor 810 may be reduced at the time of initial startup of the motor 810 for erecting the second arm 912.

The connecting rod 870 may be formed with a slider connection portion connected to the slider 860 by a hinge pin and a second arm connection portion connected to the connection portion 914 of the second arm 912 by a hinge pin.

The slider connection portion may be formed on one side of the connecting rod 870 in the longitudinal direction, and the second arm connection portion may be formed on the other side of the connecting rod 870 in the longitudinal direction.

When the slider 860 is brought close to the motor 810, the connecting rod 870 may be pulled by the slider 860 and pull the second arm 912 downward, and the second arm 912 may be laid while rotating in a direction approaching the motor 810 with respect to the arm supporters 920 and 921.

On the other hand, when the slider 860 moves away from the motor 810, the connecting rod 870 may be pushed by the slider 860 and lift the first arm 911, and the second arm 912 may be erected while rotating in a direction away from the motor 810 with respect to the arm supporters 920 and 921.

Figure 10:
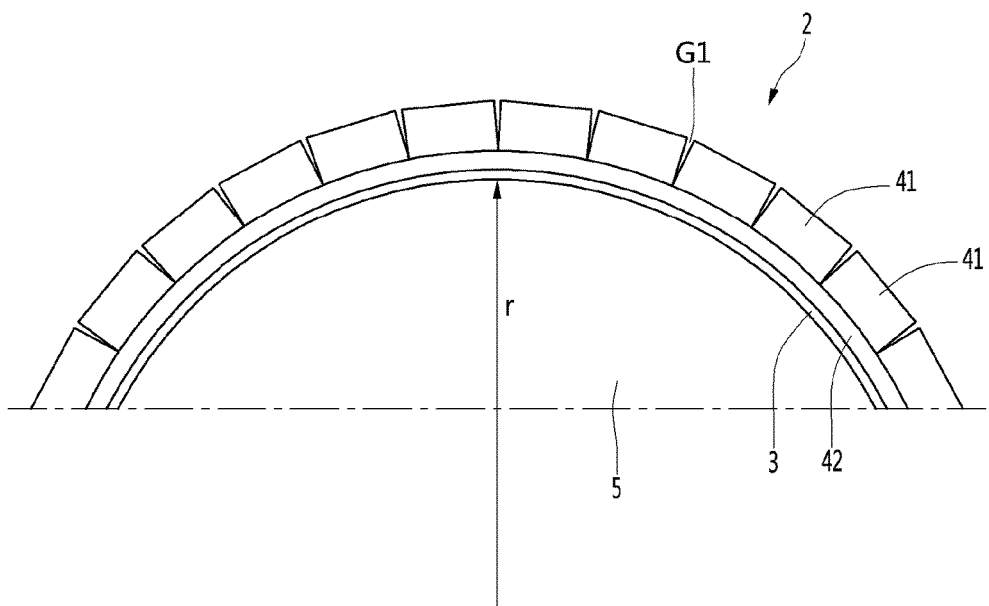
FIG. 10 is a sectional view of the display module when the display module is wound around a roller according to an embodiment of the present invention.
Figure 11:
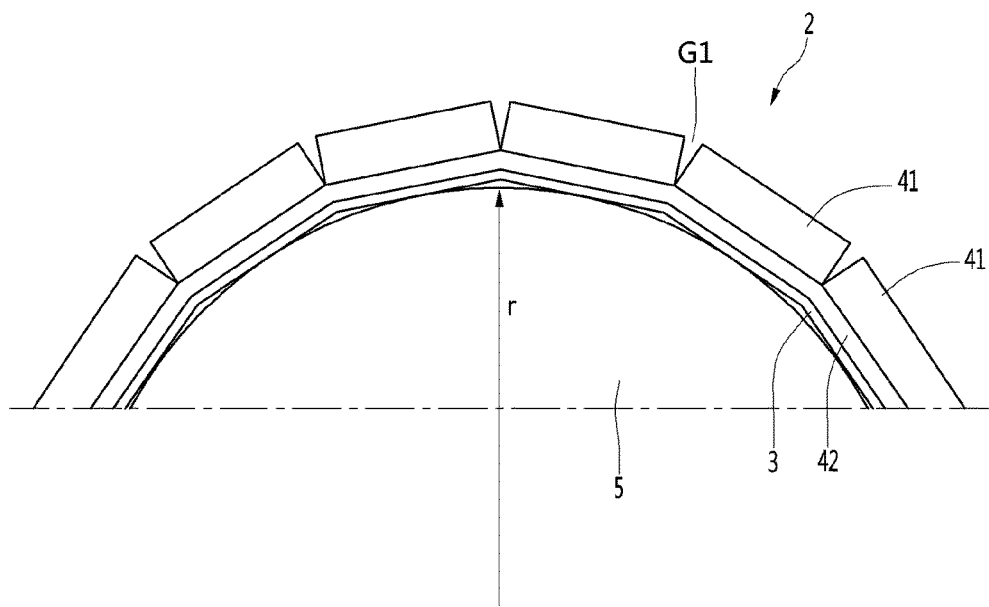
FIG. 11 is a sectional view of a display module according to a comparative example compared with an embodiment of the present invention when the display module is wound around the roller.

FIG. 10 is a sectional view of the display module when the display module is wound around the roller according to an embodiment of the present invention, and FIG. 11 is a sectional view of a display module according to a comparative example compared with an embodiment of the present invention when the display module is wound around the roller.

The display panel 3 may be varied in detailed shape depending on the heights H of the plurality of supporters 41.

As illustrated in FIG. 10, when the height H of the supporter 41 is proper to the radius r of the roller 5, the display module 2 may be rolled such that the overall shape of the display module 2 is similar to a circle as much as possible.

In contrast, as illustrated in FIG. 11, when the height H of the supporter 41 is excessively high with respect to the radius "r" of the roller 5, the display module 3 may be rolled in the shape similar to a polygonal shape along an outer circumference of the roller 5.

Meanwhile, when the height H of the supporter 41 is excessively high with respect to the radius "r" of the roller 50, the display panel 3 may be bent such that the overall shape of the display panel 3 is an angled shape as illustrated in FIG. 11. Stress may be concentrated on the bent portion of the display panel 3. When the stress is repeatedly concentrated on the display panel 3 as described above, the lifespan of the display panel 3 may be reduced. Accordingly, it is preferred that the height H of the supporter 41 is proper instead of being excessively high.

Meanwhile, when the height H of the supporter 41 is excessively low, the number of supporters 41 may be more increased with respect to the whole area of the back surface of the display panel 3 in the display device. In addition, when the display panel 3 is spread, the plurality of supporters 41 do not flatly support the entire portion of the display panel 3, but may be easily folded. Accordingly, the flatness of the display module 2 may be lowered.

In other words, it is preferred that the supporters 41 have the heights sufficient to minimize the stress concentrated on the display panel 3 while supporting the display panel 2 with the flatness as high as possible.

It is preferred that the supporter 41 has the optimal height H for winding the display module 2 such that the overall shape of the display module 2 is similar to a circle as much as possible, when the display panel 3 is wound around the roller 5.

To this end, the optimal heights H of the plurality of supporters 41 may be varied depending on the radiuses r (hereinafter, referred to as "roller radius") of the roller 5.

The optimal height H of each supporter 41 may be 0.1-0.6 times of the roller radius "r". For example, when the roller radius "r" is 50 mm, the height H of the supporter 41 may be in the range of 5 mm to 30 mm. In addition, the optimal height H of each supporter 41 may be 7-50 times of the thickness of the adhesive member 42.

Meanwhile, when the display module 2 becomes upright, important factors of determining the flatness of the display module 2 may be thicknesses T of the plurality of supporters 41.

When the thickness of each supporter 41 is excessively thin, the plurality of supporters 41 may not support the display panel 3 and thus a portion of the display panel 3 may be bent.

In contrast, when the thickness T of each supporter 41 is excessively thick, the whole thickness of a portion of the display panel 3, which is wound around the roller 5, may be increased.

When the entire portion of the display module 2 is wound around the roller 5, and when the whole thickness of the display module 2 is increased, the size of the housing 1 has to be increased.

Accordingly, it is preferred that the supporter 41 has the proper thickness such that the whole thickness of the display module 2 becomes not excessively thick when the entire portion of the display module 2 is wound.

The optimal height H of each supporter 41 may be 0.08-0.16 times of the roller radius r. For example, when the roller radius r is 50 mm, the height H of the supporter 41 may be in the range of 4 mm to 8 mm. In addition, the optimal height H of each supporter 41 may be 6.25-12.5 times of the thickness of the adhesive member 42.

Hereinafter, the following description will be made, by way of example, regarding the case that the roller radius r is 50 mm, the thickness of the display panel 3 is 0.29 mm, the thickness of the adhesive member 42 is 0.64 mm, and the display module 2 is wounded around the outer circumference of the roller 5 by 2.45 turns.

In this case, the length of the arc of a portion of the display panel 3, which is first wound around the outer circumference of the roller 5, may be determined by the roller radius r regardless of the thickness T of the supporter 41. The length of the arc may be about $2\pi r$, which is about 314 mm.

In contrast, the length of the arc of a portion of the display panel, which is second wound around the outer circumference of the roller 5, may be varied depending on the thickness T of the supporter 41 and may be about $2\pi r'$.

In this case, r' may be a radius of the portion of the display panel 3, which is second wound around the outer circumference of the roller 5, and may be the sum of the radius r of the roller 5, the thickness of the display panel 3, the thickness of the adhesive member 42, and the thickness T of the supporter 41. When the thickness of the supporter 41 is 4 mm, r' may be about 55 mm, and $2\pi r'$ may be about 345 mm.

Meanwhile, when the display module 2 is wound around the outer circumference of the roller 5 by 2.45 turns, the length of the arc of a portion of the display panel, which is third wound around the outer circumference of the roller 5, may be 0.45 times of $2\pi r''$.

In this case, r'' may be a radius of the portion of the display panel 3, which is third wound around the outer circumference of the roller 5, may be the sum of the radius r of the roller 5, twice of the thickness of the display panel 3, twice of the thickness of the adhesive member 42, and twice of the thickness of the supporter 41. When the thickness of the supporter 41 is 4 mm, r'' may be about 60 mm, and 0.45 times of $2\pi r''$ may be about 169.7 mm.

The thickness T of the supporter 41 may be in the range of 0.26-0.8 times of the height H of the supporter 41.

When the radius of the roller 5 is 50 mm, the first example of the supporter 41 may be the case that the thickness T of the supporter 41 may be 4 mm when the height H of the supporter 41 is 5 mm.

The second example of the supporter 41 may be the case that the thickness T of the supporter 41 may be 6 mm when the height H of the supporter 41 is 15 mm.

The third example of the supporter 41 may be the case that the thickness T of the supporter 41 may be 8 mm when the height H of the supporter 41 is 30 mm.

In the display module 2 described above, stress applied to a portion (that is, a roller connection portion) connected to the roller 5 and a portion (that is, an upper bar connection portion) connected to the upper bar 60 may be greater than stress applied to the intermediate portion between the roller connection portion and the upper bar connection portion.

Figure 12:
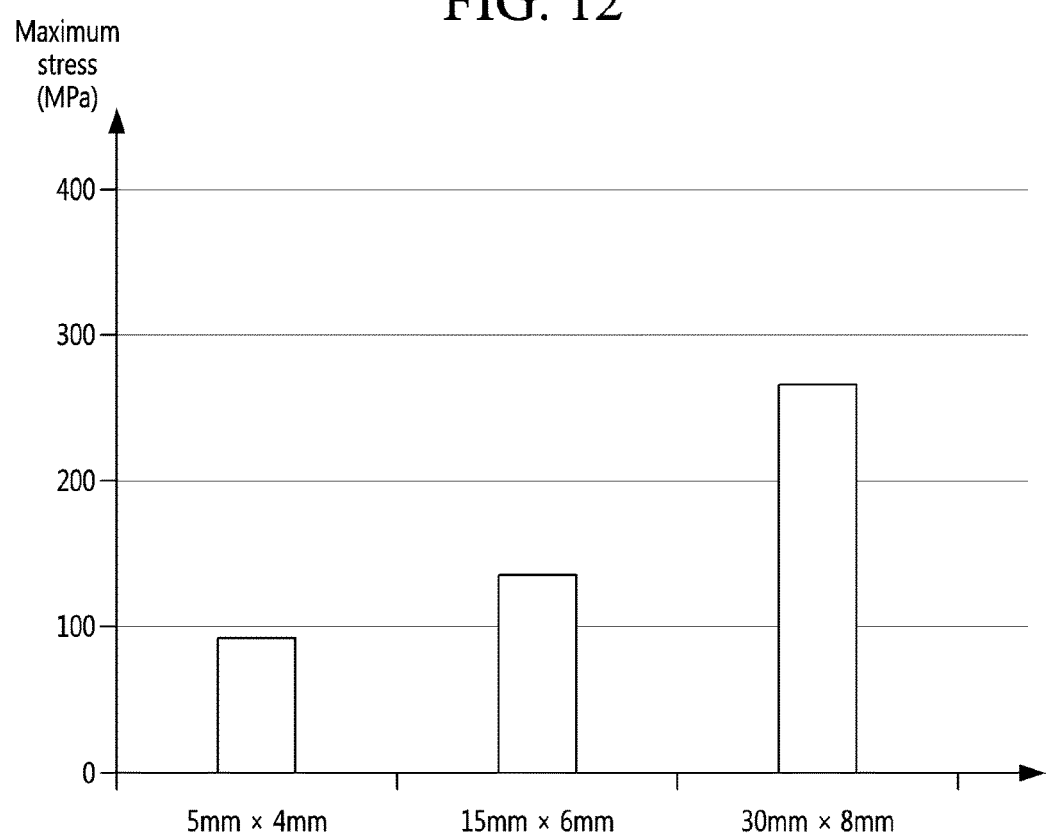
FIG. 12 is a graph illustrating the maximum stress applied to a portion of the display panel except for a roller connection portion and an upper bar connection portion according to an embodiment of the present invention.

FIG. 12 is a graph illustrating the maximum stress applied to a portion of the display panel except for the roller connection portion and the upper bar connection portion according to an embodiment of the present invention.

Referring to FIG. 12, it may be recognized that the maximum stress applied to the display panel 3 is reduced as the size of the supporter 41 is reduced, and the maximum stress applied to the display panel 2 represents the least value in the first example among the first to third examples.

Figure 13:
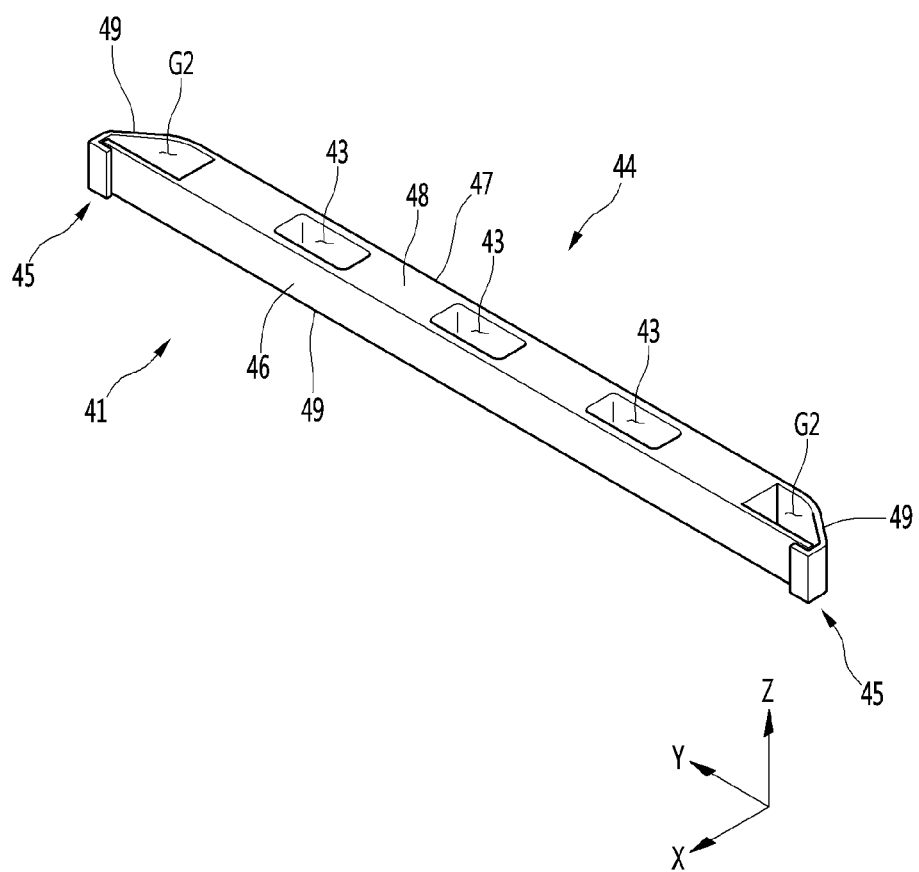
FIG. 13 is a perspective view of a supporter according to an embodiment of the present invention.
Figure 14:
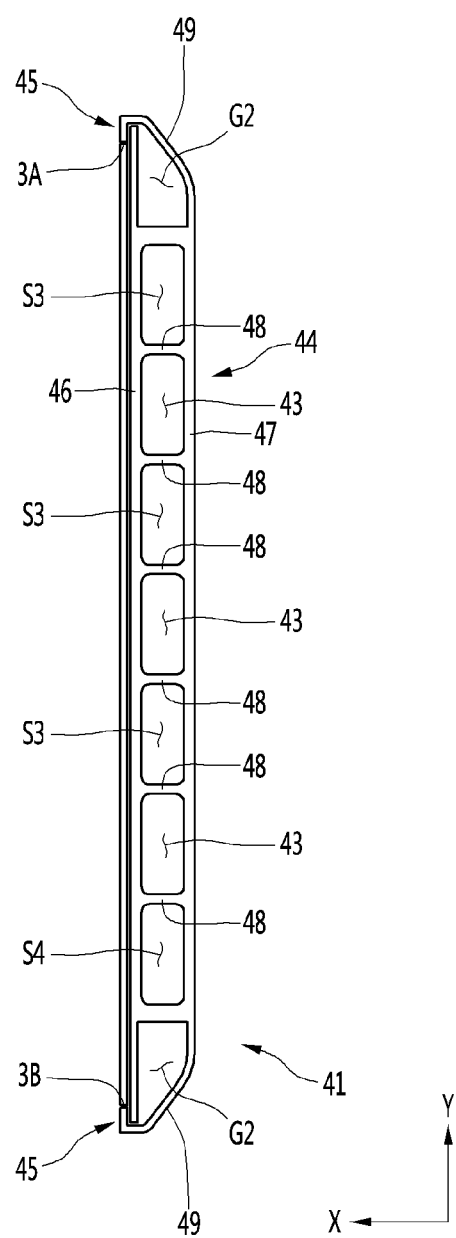
FIG. 14 is a sectional surface taken along line A-A of FIG. 1.

FIG. 13 is a perspective view of a supporter according to an embodiment of the present invention, and FIG. 14 is a sectional surface taken along line A-A of FIG. 1.

According to the present embodiment, the supporter 41 may be formed in the shape of a non-hollowed cylinder or may have a structure having at least one opening 43 formed through the supporter 41 for lightweight. The opening 43 may have the shape which is open in the vertical direction and may be formed through the supporter 41 in the vertical direction. The opening 43 is an open space opened in the vertical direction Z. The opening 43 can be a conduit through which the cable 64 passes.

Meanwhile, the supporter 41 may be formed therein with an empty space S3 extending in the horizontal direction Y. The empty space S3 may extend in a lengthwise direction of the supporter 41. The space S3 is an enclosed space formed inside the supporter. And The space S3 is formed long in the longitudinal direction Y of the supporter 41. The weight of the supporter 41 can be reduced by forming the opening 43 and the space S3 in the supporter 41.

The opening 43 may be positioned beside the empty space S3 in the horizontal direction. The opening 43 and the empty space S3 may be separated from each other by a connection wall 48.

A plurality of openings 43 may be provided in the supporter 41, and may be spaced apart from each other in the horizontal direction of the supporter 41, that is, in the lengthwise direction Y of the supporter 41.

The supporter 41 may include a rear cover 44 bonded to the back surface of the display panel 3 by the adhesive member 42 and a side cover 45 protruding from the rear cover 44 to cover lateral sides 3A and 3B of the display panel 3.

The rear cover 44 may include a front body 46 and a rear body 47 positioned at a rear portion of the front body 46 and spaced apart from the front body 46 in a front-rear direction.

The front surface of the front body 46 may be an adhesive-member-attached surface bonded to the back surface of the adhesive member 42.

The rear cover 44 may be interposed between the front body 46 and the rear body 47 and may further include a plurality of connection walls 48 to connect the front body 46 to the rear body 47. The plurality of connection walls 48 may be formed to be spaced apart from each other in the lengthwise direction Y of the supporters 41. Some of the plurality of connection walls 48 have openings 43 formed together with another connection wall 48 adjacent to the some connection walls 48 in the horizontal direction. In other words, the opening 43 may be open in the vertical direction Z between a pair of connection walls 48, which are spaced apart from each other in the horizontal direction, of the plurality of connection walls 48.

The plurality of connection walls 48 may form the empty space S3 together with another connection wall 48 adjacent thereto in the horizontal direction.

The rear cover 44 may further include a top body 48 to connect an upper end of the front body 46 to an upper end of the rear body 47 and a lower body 49 to connect a lower end of the front body 46 to a lower end of the rear body 47.

The top body 48 and the lower body 49 may be formed only in a region without the opening 43, and the empty space S3 of the supporter 41 may be formed by the front body 46, the rear body 47, the top body 48, the lower body 49, and a pair of connection walls 48 adjacent to each other in the horizontal direction.

Meanwhile, the side cover 45 may include a side body 49 bent from the rear body 46 to shield a gap G2 between the front body 46 and the rear body 47.

The plurality of supporters 41 described above may serve as a passage of the cable 64 (see FIG. 6) and at least one opening 43 formed in the supporter 41 may serve as a cable through hole through which the cable 64 passes.

Supporters, which are positioned under the upper bar 60, of the plurality of supporters 41 may be arranged in such a manner that the openings 43 communicate with in the vertical direction. The cable 64 may be placed while passing through the openings 43 of the plurality of supporters 41.

The above description is merely illustrative of the technical idea of the present invention, and various modifications and changes may be made by those skilled in the art without departing from the essential characteristics of the present invention.

Therefore, the embodiments disclosed in the present invention are not intended to limit the scope of the present invention, and the scope of the present invention is not limited by these embodiments.

The scope of protection of the present invention should be construed according to the following claims, and all technical ideas within the scope of equivalents thereof should be construed as falling within the scope of the present invention.

What is claimed is:

1. A display device comprising: a roller; and a display module configured to be rolled around the roller, wherein the display module comprises: a display panel; and a plurality of supporters disposed at a rear of the display panel and configured to support the display panel, wherein the plurality of supporters extend in a horizontal direction, wherein a ratio of a height of each supporter to a radius of the roller is in a range of 0.1:1 to 0.6:1, wherein each of the plurality of supporters comprises: a rear cover disposed at the rear of the display panel; and a side cover protruding from the rear cover to cover a lateral side of the display panel.

2. The display device of claim 1, wherein a ratio of a thickness of each supporter to the radius of the roller is in a range of 0.08:1 to 0.16:1.

3. The display device of claim 2, wherein the display module further comprises an adhesive member disposed between a front surface of the supporter and a back surface of the display panel,
wherein a ratio of the height of each supporter to a thickness of the adhesive member is in the range of 7:1 to 50:1.

4. The display device of claim 3, wherein a ratio of the thickness of each supporter to the thickness of the adhesive member is in the range of 6.25:1 to 12.5:1.

5. The display device of claim 1, wherein the supporter comprises at least one opening formed through the supporter in a vertical direction.

6. The display device of claim 5, wherein the supporter comprises a plurality of openings spaced apart from each other in the horizontal direction.

7. The display device of claim 1, further comprising:
an upper bar disposed at an upper portion of the display module;
a source printed circuit board (PCB) disposed on the upper bar;
a timing controller board disposed on the roller; and
at least one cable connecting the source PCB to the timing controller board,
wherein the plurality of supporters are formed with corresponding openings which are configured to allow the cable to be passed therethrough.

8. The display device of claim 1, wherein the rear cover comprises:
a front body; and
a rear body positioned at a rear of the front body and spaced apart from the front body in a front-rear direction.

9. The display device of claim 8, wherein the rear cover further comprises:
a top body connecting an upper end of the front body to an upper end of the rear body; and
a lower body connecting a lower end of the front body to a lower end of the rear body.

10. The display device of claim 8, wherein the side cover comprises a side body extending at an angle from the rear body to cover a gap between the front body and the rear body.

11. The display device of claim 1, wherein each of the plurality of supporters comprises a space extending in the horizontal direction.

12. A display device comprising: a roller; and a display module configured to be rolled around the roller, wherein the display module comprises: a display panel; an adhesive member fixed to a back surface of the display panel; and a plurality of supporters fixed to the back surface of the display panel via the adhesive member and configured to support the display panel, wherein the plurality of supporters extend in a horizontal direction, wherein a sectional shape of each supporter is rectangular and positioned longitudinally in a vertical direction when the display module is extended from the roller, and wherein a ratio of a height of each supporter to a radius of the roller is in a range of 0.1:1 to 0.6:1, wherein each of the plurality of supporters comprises: a rear cover disposed at the rear of the display panel; and a side cover protruding from the rear cover to cover a lateral side of the display panel.

13. The display device of claim 12, wherein a ratio of a thickness of each supporter to the radius of the roller is in a range of 0.08:1 to 0.16:1.

14. The display device of claim 12, wherein a ratio of a thickness of the supporter to the height of the supporter is in a range of 0.26:1 to 0.8:1.

* * * * *